(12) United States Patent
Bao et al.

(10) Patent No.: US 8,384,219 B2
(45) Date of Patent: Feb. 26, 2013

(54) SEMICONDUCTOR HAVING INTERCONNECTS WITH IMPROVED MECHANICAL PROPERTIES BY INSERTION OF NANOPARTICLES

(75) Inventors: Junjing Bao, Fishkill, NY (US);
Tien-Jen J. Cheng, Bedford, NY (US);
Naftali E. Lustig, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/362,292

(22) Filed: Jan. 31, 2012

(65) Prior Publication Data

US 2012/0146224 A1    Jun. 14, 2012

Related U.S. Application Data

(62) Division of application No. 12/885,596, filed on Sep. 20, 2010, now Pat. No. 8,129,269.

(51) Int. Cl.
*H01L 23/538* (2006.01)

(52) U.S. Cl. .......... 257/751; 257/762; 257/E23.174

(58) Field of Classification Search .............. None
See application file for complete search history.

(56) References Cited

U.S. PATENT DOCUMENTS

| | | | |
|---|---|---|---|
| 7,611,757 | B1 | 11/2009 | Bandyopadhyay et al. |
| 2008/0122103 | A1 | 5/2008 | Bonilla et al. |
| 2008/0166506 | A1 | 7/2008 | Shin et al. |
| 2009/0258230 | A1 | 10/2009 | Schlossman et al. |

OTHER PUBLICATIONS

International Search Report/Written Opiinion, Apr. 9, 2012.
"Crack and Damage Evaluation in Low-K BEOL Structure Under CPI Aspects", Auersperg, et al., Electronics Packaging Technology Conference, 2009, EPTC '02, 1th., Dec. 9, 2009; pp. 596-599.
"Cu/ULK Integration a Post Integration Porogen Removal Approach", Fayolle, et al., Intrconnect Technology Conference, 2004, Proceedings of IEEE, 2004 International, Jun. 7, 2004; pp. 208-210.
"Challenges of Ultra Low-K Integration in BEOL Interconnect for 45 nm and Beyond", Liu, et al., Interconnect Technology Conference, 2009, IITC2009, IEEE International, Jun. 1, 2009; pp. 258-260.
Kumbhakar, et al; Chemical Synthesis and Visible Photoluminescence EMission From Monodispersed ZnO Nanoparticles,; Chalcogenide Letters vol. 5, No. 12, Dec. 2008, p. 387-384.
Peskia, et al; Determination of the Particle Size Distribution of Quantum Nanocrystals from Absorbance Spectra; Advanced Materials 2003, 15 No. 15 Aug. 5.
Sun, et al., Purification and stabilization of colloidal ZnO nanoparticles in methanol; Springer Science+Business Media, LLC 2007.
Chen, et al., Optical Properties and Photoconductivity of Amorphous Silicon Carbon Nitride Thin Film and Its Application for UV Detection; Diamond and Related Materials 14 2005 1010-1013.

*Primary Examiner* — Seahvosh Nikmanesh
(74) *Attorney, Agent, or Firm* — H. Daniel Schnurmann

(57) ABSTRACT

In a BEOL process, UV radiation is used in a curing process of ultra low-k (ULK) dielectrics. This radiation penetrates through the ULK material and reaches the cap film underneath it. The interaction between the UV light and the film leads to a change the properties of the cap film. Of particular concern is the change in the stress state of the cap from compressive to tensile stress. This leads to a weaker dielectric-cap interface and mechanical failure of the ULK film. A layer of nanoparticles is inserted between the cap and the ULK film. The nanoparticles absorb the UV light before it can damage the cap film, thus maintaining the mechanical integrity of the ULK dielectric.

22 Claims, 5 Drawing Sheets

US 8,384,219 B2

SEMICONDUCTOR HAVING INTERCONNECTS WITH IMPROVED MECHANICAL PROPERTIES BY INSERTION OF NANOPARTICLES

FIELD OF THE INVENTION

The present invention relates generally to semiconductor integrated circuits and devices, and more particularly, to semiconductors with interconnects having mechanical properties improved by way of nanoparticles.

BACKGROUND

Semiconductor based devices and circuits consist of active devices, typically transistors, on a silicon wafer surface and a set of conducting wires interconnecting them. This set of wires is typically referred to as the back-end-of-line (BEOL) while the active transistors are referred to the front-end-of-line (FEOL). A complex network of conducting interconnects is desired in order to electrically wire up the large number of devices, thus creating functional circuits. This is accomplished by building a multi-level structure consisting of metallic lines embedded in an insulating dielectric medium. Modern high speed interconnects typically consist of copper (Cu) conductors which are insulated from one another by low dielectric constant (low k) materials. The interconnect structure may consist of as many as fifteen vertically stacked levels of metal with conducting path between levels, called vias. The wires are characterized by their line width and the distance to the nearest neighbor. The sum of this wire width and space is referred to as the pitch. The first few levels of wiring are built at the minimum allowed technology pitch, as determined by lithography. The tight pitch allows for building the densest circuitry, with the higher levels built at multiples of the minimum pitch. This hierarchical structure allows for thick wide lines, also referred to as fat wires, at the higher levels which are typically used for distributing signals and power across the chip. In addition to serving as an electrical insulator the dielectric material provides mechanical support for the multilevel structure.

At present, Cu/low-k multi-level structures are typically formed by dual damascene processing as follows: the dielectric material is deposited as a blanket film, lithographically patterned, and then reactive ion etched (RIE), creating both trenches and vias. The pattern is then coated by a refractory metal barrier such as Ta and TaNx followed by a thin sputtered copper seed layer. The seed layer allows for the electrochemical deposition (ECD) of a thick copper layer which fills up the holes. Excessive copper is removed and the surface is planarized by chemical mechanical polishing (CMP). Lastly, a thin dielectric film also known as 'cap' is deposited over the patterned copper lines. This dual damascene process is repeated at each of the higher levels built.

As predicted by Moore's law, semiconductor devices continue to scale down in order to improve device performance and place more transistors on the substrate. The corresponding scaling of the interconnect structure causes an increase the parasitic resistance (R) and capacitance (C) associated with the copper/low-k interconnects. The RC product is a measure of the time delay introduced into the circuitry by the BEOL. In order to reduce the RC delay, low-k and ultra low-k (ULK) materials are used as dielectrics.

A typical type of low-k dielectric is an organo-silicate glass material, also referred to as SiCOH. It consists of cross-linked $SiO_2$-like tetrahedral structures as the backbone and some $—CH_3$ or $—H$ as the terminal groups or side chains to lower polarizability, introduce porosity and reduce volume density. The low-k dielectrics are typically deposited by plasma enhanced chemical vapor deposition (PECVD) process, which mixes the organic precursor for sacrificial porogen (e.g., cyclohexene, and the like) and the matrix precursor for the low-k backbone structure. (e.g., decamethylcyclopentasiloxane, diethoxymethylsilane, dimethyldimethoxysilane, tetramethylcyclotetrasilane, octamethylcyclotetrasilane, and the like). The deposition step is followed by an ultraviolet (UV) curing process to remove the volatile organic porogen which is loosely bonded to the low-k backbone. As a result, porosity is introduced into the low-k dielectrics. In addition, the UV curing process also induces the cross-linking of low-k dielectrics, improving the mechanical strength. However, ULK films are known to be mechanically weaker than their non-porous low-k counterparts. With porosity and reduced dielectric constant comes a reduction in the film's Young modulus. Typical ULK moduli are in the 2-8 GPa range, depending on the degree of porosity, making the ULK films especially susceptible to mechanical stresses during BEOL processing and during chip packaging.

The dielectric film, which caps the top of the damascene metal structure, prevents copper out-diffusion into the surrounding low-k dielectric. From the perspective of performance and reliability, physical and electrical properties of the cap dielectric, such as breakdown voltage, adhesion to underlying metal and dielectrics, hermeticity, internal stress and elastic modulus, are very important. In general, mechanically compressive films with good adhesion to copper help suppress Cu electromigration and provide a mechanically robust structure. Denser compressive films also tend to have a higher breakdown voltage and provide enhanced hermeticity and passivation of the copper lines. A typical dielectric barrier used in advanced semiconductor manufacturing is an amorphous nitrided silicon carbide (SiCNH).

The UV radiation used in the curing process of ULK dielectrics ranges in wavelength from 200 nm to 600 nm and is generated by a UV bulb, illustrated hereinafter with reference to FIG. 1. The radiation can penetrate through the ULK film and damages the SiCNH cap leading to a change in its mechanical stress state from compressive to tensile. This in turn can lead to spontaneous cracking of the porous ULK material above the cap and to poor reliability during chip packaging operation. An existing solution is to replace a conventional single layer SiCHN with a bilayer low-k cap. This solution has two issues: first, the stress state of the cap still changes albeit at a slower rate. The film stays compressive only if the UV cure time is short (<70 sec). Typical ULK cure times are greater than 100 sec. For these longer cure times, the bilayer cap stress state turns tensile; and second, the bilayer cap with a nitrogen-rich SiCNH on the bottom and carbon-rich SiCNH at the top tends to shrink under UV radiation. A rough estimate is about 2% thickness under 70 s of UV cure while the thickness change of high-k (standard) SiCNH is around zero under the same irradiation conditions. This shrinking of the cap is undesirable and can lead to additional mechanical stresses on the BEOL structure.

Referring to FIG. 2, the internal stress change (measured in MPa) of a SiCHN cap film due to exposure to UV during the ULK cure is illustrated. The stress measurement is shown for different cap materials at different UV cure times. More specifically, the stress change due to the exposure to UV during the ULK curing process shows that the internal stress changes from a negative value (compressive stress) to a positive value (tensile stress) as the UV cure time increases. The curve identified as SiCNH high-k represents a conventional deposition process, while the second curve referenced as SiCNH low-k represents the bilayer deposition process. Although the bilayer cap can slow down the stress change rate, the film ultimately turns tensile. (i.e. crosses the y-axis from negative to positive values) This change from compressive to tensile stress can be understood in terms of a bond breaking mechanism in the SiCHN film upon absorption of the high energy UV photons. The resulting broken, also known as dangling, bonds lead to an increase in internal open spaces and a reduced compressive stress. Tensile films are more prone to cracking and loss of adhesion to the underlayer pattern.

FIG. 3 shows the thickness of the bilayer low-k cap shrinked upon exposure to UV radiation. This cap film loses about 2% of its initial thickness due to the loss of bonded hydrogen and carbon groups in the film. Conventional high-k SiCNH does not shrink in thickness upon a similar exposure to UV radiation.

Referring to FIG. 4, the UV-VIS absorption characteristics of typical metal oxide, e.g., ZnO dispersed in double distilled water along-with the associated reactants are shown. Curves 1, 2, and 3 correspond to PVP (polyvinylpyrrollidone used to prevent agglomeration), ZnO nanoparticles, and $Zn(NO_3)_2$, respectively. ZnO nanoparticles can be synthesized by way of different types of alcoholic solutions such as methanol, ethanol, propanol, or higher alcohols.

X-ray diffraction, TEM, and EDAX are used to verify the formation of ZnO nanoparticles. The absorption peak for the ZnO nanoparticles is observed at 262 nm, which lies below the bandgap wavelength (shown as the dotted line in FIG. 4) of 388 nm ($E_g$=3.2 eV) of bulk ZnO. The shift in the absorption edge to lower wavelength is a fundamental property of nanoparticles and is attributed to a widening of the bandgap when particle sizes become small.

Referring to FIG. 5, the nanoparticle size effect on peak absorbance wavelength is illustrated for various particle diameters. The ZnO nanoparticles show peak absorbance at approximately 262 nm when the average particle size is 2.1 nm. The circular point in FIG. 5 indicates the value of the average particle size as obtained from TEM analysis. From the foregoing, it is evident that ZnO nanoparticles exhibit significant confinement effects for particle diameters less than about 8 nm.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the, wherein like reference numerals denote like elements and parts, in which.

SUMMARY

Figure 1:
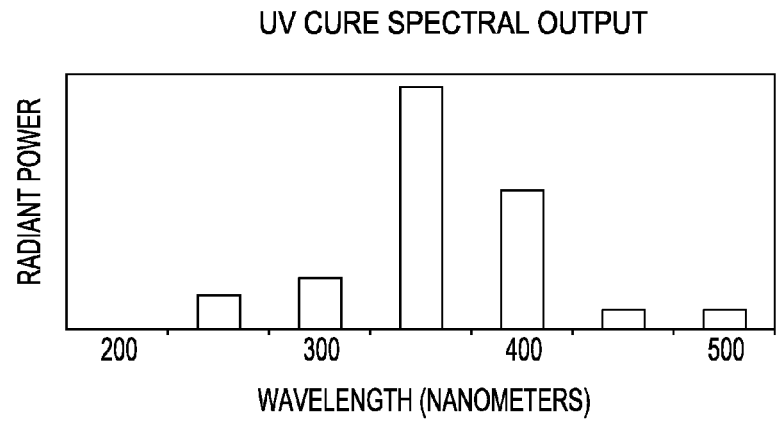
FIG. 1 is a plot of radiant power vs. wavelength showing the spectral output of a UV bulb, as it is known in the prior art.

In one aspect, the invention described the insertion of nanoparticles between the cap material covering the metal interconnects and the ULK insulating dielectric material above it. The use of nanoparticles leads to reduced ultraviolet (UV) radiation damage during processing. In the absence of radiation damage, the cap material remains mechanically compressive thus increasing the strength of the BEOL structure. Ultraviolet radiation used in an embodiment of the present invention is preferably generated by a UV bulb having a spectrum ranging from 200 nm to 600 nm with a large proportion of the wavelength preferably below 400 nm.

A layer of multi-sized nanoparticles is inserted between the cap and ULK to absorb UV radiation during the ULK curing process. The nanoparticles are preferably made of a metal oxide with a diameter ranging from 1 nm to 4 nm. This range of nanoparticle sizes ensures a high absorption of UV radiation up to approximately 375 nm. The absorption edge for SiCNH films as a function of the carbon content of the films is approximately 400 nm for 26% carbon. In one embodiment, the films range between 20-26% carbon as determined by RBS. Radiation with wavelength longer than 400 nm is transmitted through the SiCNH films and cannot cause the damage which drives the films into tensile stress. On the other hand, about 90% of the UV bulb spectrum that lies between 200 nm to 400 nm that can damage the SiCNH films is absorbed by the nanoparticles.

The formation of a monolayer of nanoparticles is instrumental in providing a robust structure capable of handling mechanical stresses, particularly during the manufacture of semiconductor back end (BEOL) and subsequent integration. A monolayer of nanoparticles is provided, preferably made of metal oxide, such as ZnO or $TiO_2$, and capable of attenuating and absorbing UV radiation used in the formation of ultra low-k dielectrics.

In a further aspect, in one embodiment of the present invention, the nanoparticles are placed between a SiCNH cap and an ultra low-k dielectric such that UV radiation is absorbed, the cap being protected from UV damage and the associated compressive to tensile stress change. (Note: the cap applies to the next level, serving as a base for the next nanoparticle deposition, since there is a need for nanoparticles protection against UV at every ULK level of the multilevel structure being built). The size of the nanoparticles is adjusted to absorb UV radiation efficiently at certain wavelengths.

In still another aspect, the invention provides nanoparticles spun on the cap, and dried by removing the solution, the solution being made of methanol or other organic alcohols.

In yet another aspect, one embodiment of the invention includes: a) spinning nanoparticles and drying them out by way of an organic solution, the solution made of methanol or other alcohols; b) depositing the next level ULK with a UV cure; c) ULK etching followed by removing nanoparticles with organic solvents at open area created by the etching, using DHF to clean solvents and other residuals; d) in-situ depositing TaN/Ta liner and Cu seed followed by an electroplated copper and an anneal; and e) removing the overburden (excess) Cu/liner by CMP, followed by depositing a SiCNH cap layer.

In still a further aspect, the invention replaces the UV inflicted damage to the cap that becomes tensile under UV radiation from higher levels, which leads to the formation of cracks at the ULK/cap interface. Introducing a bilayer low-k cap operates only within certain UV conditions, the thickness thereof shrinking under the UV radiation. Furthermore, dimensional changes may undermine the integrity of the BEOL structure.

In another aspect, an embodiment of the invention provides a multi-layer structure that includes: one or more ultra low-k (ULK) dielectric layers with each alternating ULK dielectric layer having a plurality of metal filled trenches and vias formed therein; a cap, capping and sealing the ULK dielectric layers having the plurality of metal filled trenches and vias; and nanoparticles forming a monolayer at an interface between the ULK dielectric layers and the caps.

DETAILED DESCRIPTION

The present invention will now be described in greater detail by way of the following discussion with reference to the drawings that accompany the present application. It is observed that the drawings of the present application are provided for illustrative purposes only.

One embodiment of the present invention will be described hereinafter. For simplicity and clarity of illustration, elements shown in the drawings have not necessarily been drawn to scale. For example, the dimensions of some of the elements may be exaggerated relative to other elements for clarity.

Figure 6:
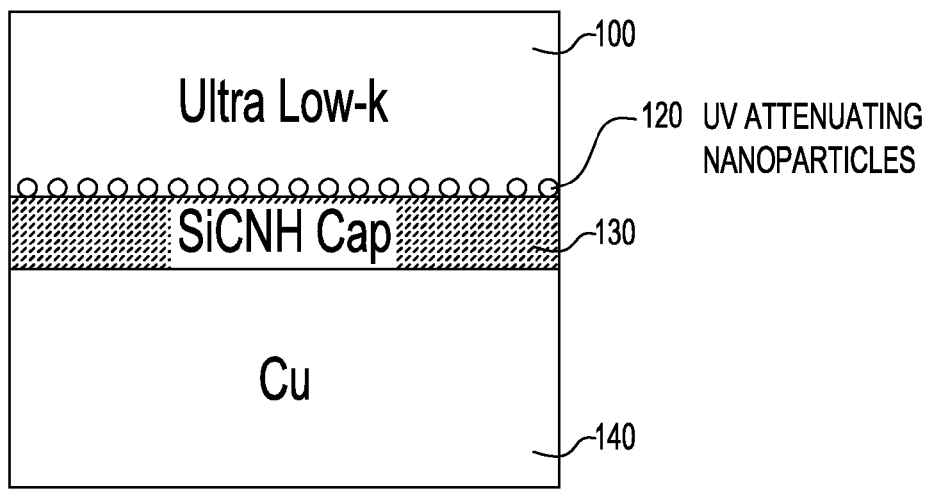
FIG. 6 illustrates a side cross sectional view of a structure showing a multi-distributed size nanoparticles between an ultra low-k (ULK) dielectric and a SiCNH cap, allowing UV rays with broad wavelength to be absorbed, according to one embodiment of the present invention.

FIG. 6 illustrates an embodiment of the inventive structure showing nanoparticles 120 spun on top of the SiCNH cap layer 130 on top of Cu layer 140, wherein the nanoparticles are preferably dried out by organic solutions. The SiCNH film can be made with a thickness ranging between 150 Å and 500 Å, and is used to cap the damascene copper pattern below. The ULK layer 100 spun over the nanoparticles is preferably made of a low K organo silicate dielectric such as SiCOH, with a thickness range of 500 Å-10000 Å.

The nanoparticles 120 are preferably made of metal oxides, e.g., ZnO. It is understood that other materials with similar characteristics, such as $TiO_2$ and the like, may be advantageously used. The preferred diameter of the nanoparticles ranges between 1 nm and 4 nm. The nanoparticles are uniformly spun (spin-coated) forming a monolayer. It has been shown that ZnO or $TiO_2$ nanoparticles can be successfully synthesized in different types of alcoholic solutions, including methanol, ethanol and higher alcohols.

Figure 2:
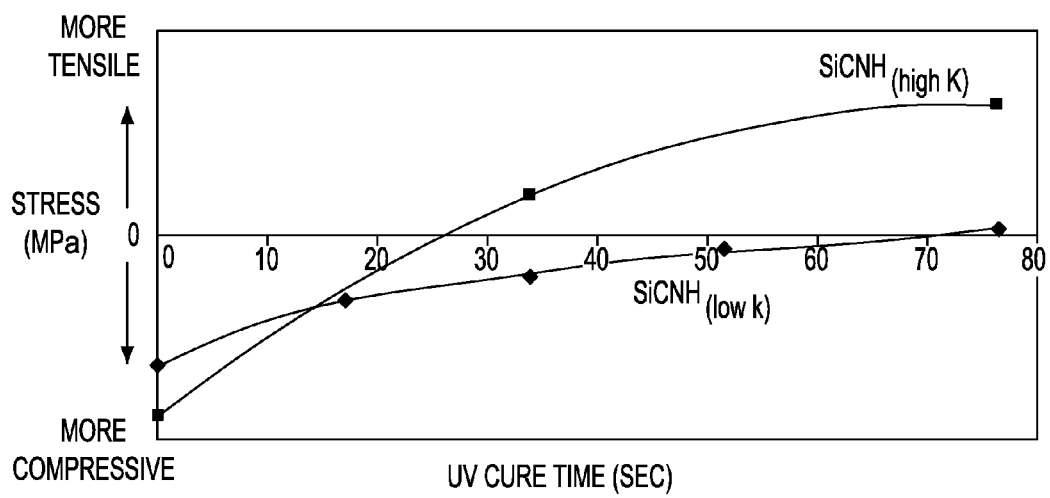
FIG. 2 is a plot showing the internal stress change of a single layer and a bilayer SiCHN cap film due to exposure to UV radiation during ULK cure, as it is known in the prior art.
Figure 3:
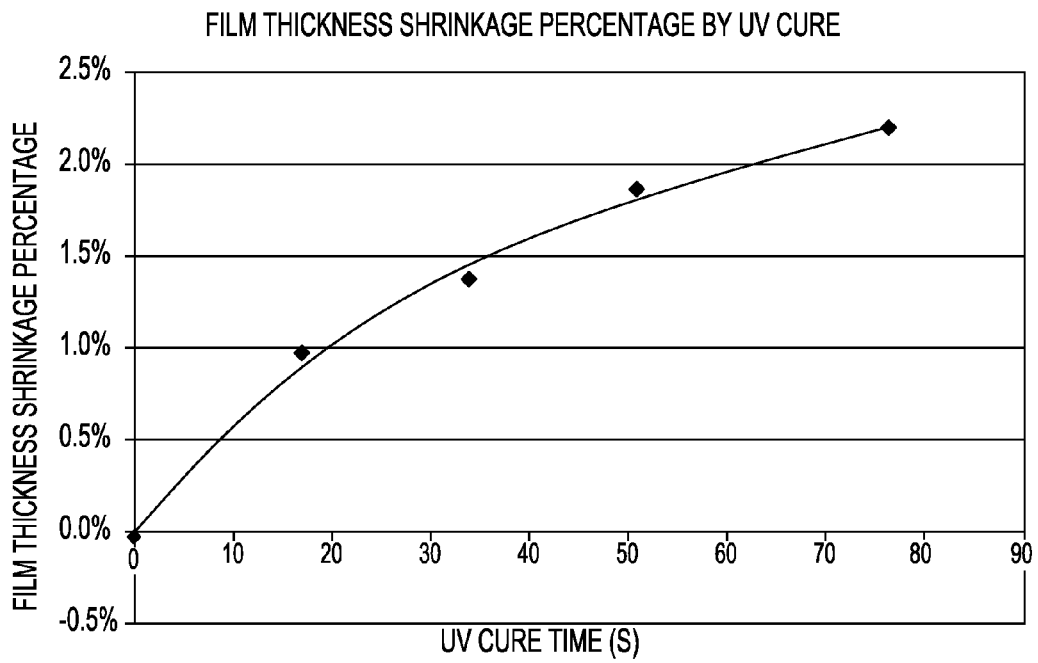
FIG. 3 shows a graph, plotting the percent film thickness shrinkage of a bilayer low-k cap vs. UV cure time. This shrinkage is attributed to the loss of bonded hydrogen and carbon, as it is known in the prior art.
Figure 4:
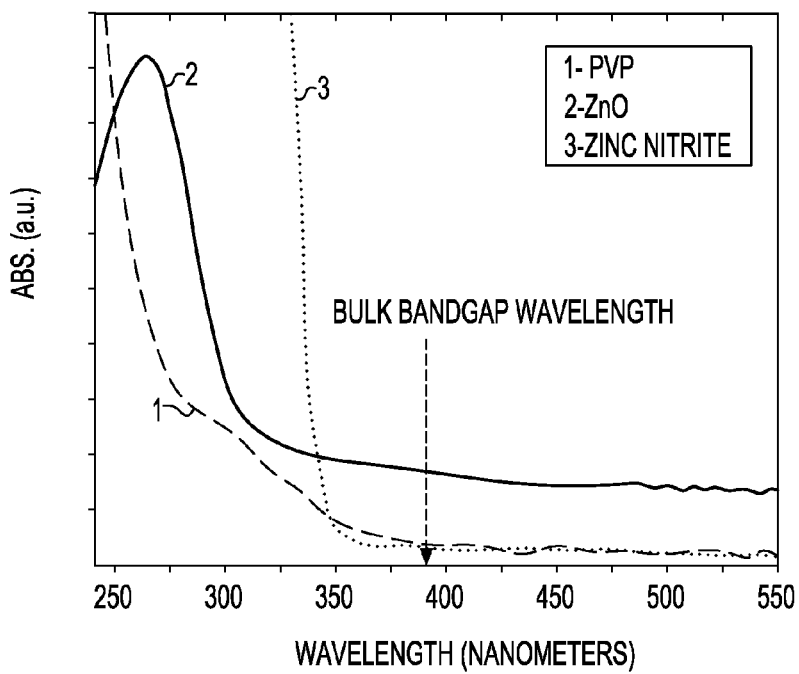
FIG. 4 shows UV-VIS absorption characteristics of ZnO nanoparticles, as it is known in the prior art.

The size of the nanoparticles can be adjusted to absorb efficiently the UV radiation at certain wavelength frequency. As previously described, the purpose of the nanoparticles is to protect the SiCNH cap from UV rays radiation, therefore protecting the cap from changing its internal stress from compressive to tensile. The as-deposited cap is compressive. Upon exposure to UV radiation the cap turns tensile as previously shown in FIG. 2. Tensile films tend to crack more easily than compressive films. A crack in the cap film can induce cracking in the low modulus ULK film with which it is in contact thereof. The nanoparticles are preferably made having multi-distributed sizes (mostly 1 nm to 4 nm) so that most of the UV can be absorbed efficiently.

Figure 5:
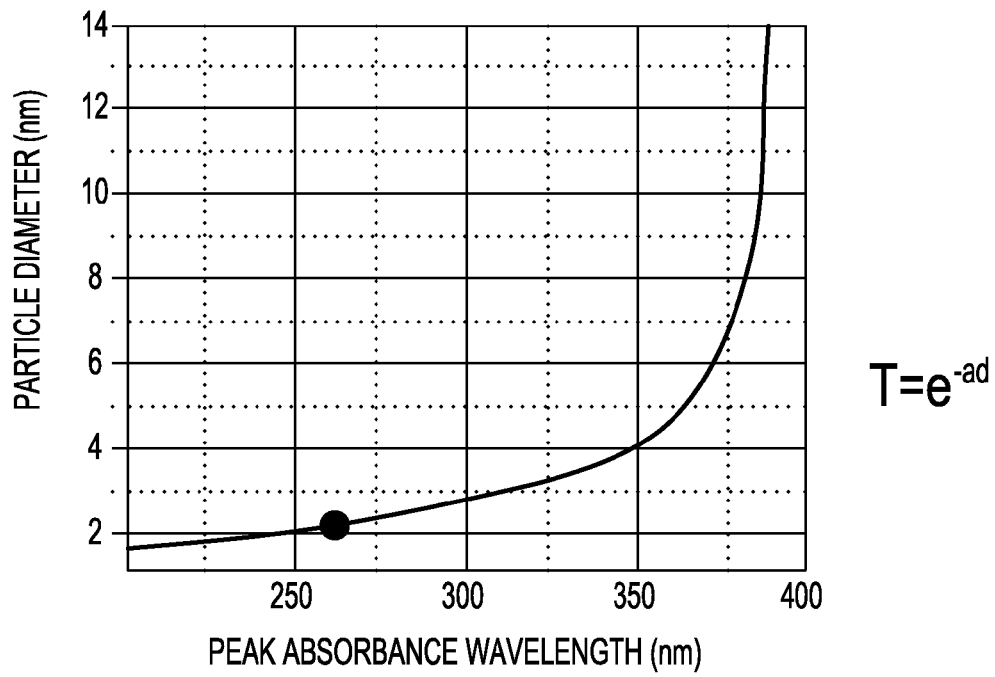
FIG. 5 illustrates the effect of the size of nanoparticles (e.g., ZnO nanocolloid) on peak absorbance wavelength, as known in the prior art.

Peak absorption, as was previously shown with reference to FIG. 5 varies with particle sizes. The absorption peak shifts to shorter wavelength as the particle size decreases due to a quantum confinement effect. The intent is to absorb radiation with wavelength shorter than about 400 nm, wherein the UV bulb, as previously shown with reference to FIG. 1, puts out most of its UV radiation, and where the SiCHN cap has an absorption edge.

Radiation is absorbed by the nanoparticles through electronic transitions from the top of the valence band up to the conduction band. The excited electrons drop back to the valence band, typically by a sequence of transitions through defect states in the optical band gap. The resulting photoluminescence spectra peaks around 550 nm (visible light) for ZnO.

Figure 7:
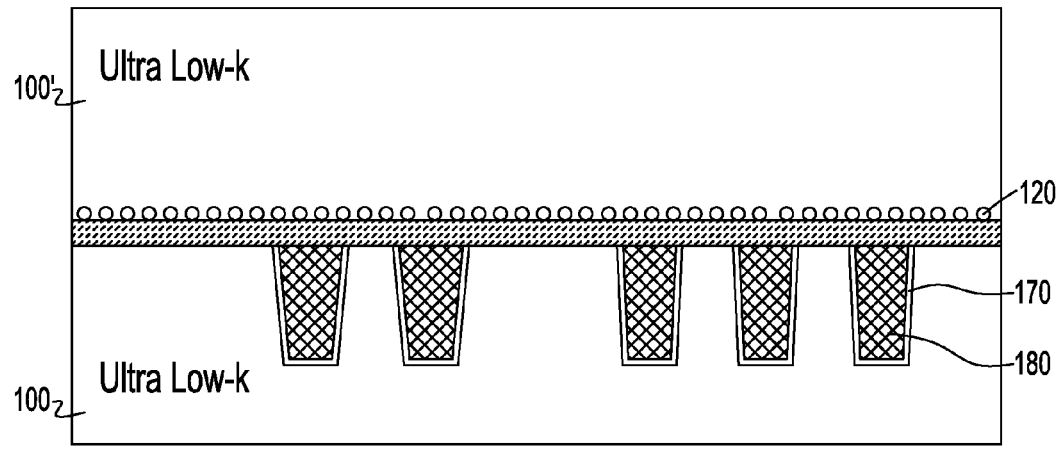
FIG. 7 shows a side cross sectional view of converting the structure into a multi-level interconnect configuration by deposition of a second ULK level with UV cure.

Referring to FIG. 7, trenches having a critical dimension (CD) ranging 40 nm to 1000 nm are then formed at selected locations, having the sides thereof lined by way of a liner 170, preferably, made of but not limited to Ta/TaN, and having a thickness of approximately 10 nm or less. Then, the trenches are coated preferably with PVD (physical vapor deposition) Cu seeds, using for instance sputtering, and having a thickness of the order of about 100 nm or less. This is followed by electroplated copper fill 180.

The structure thus formed is converted into a multi-level interconnect configuration. A new ultra-low-k layer 100' similar to the previous one, is deposited preferably using PECVD on top of monolayer of nanoparticles 120 (i.e., with the sizes ranging 1 nm-4 nm) followed by UV cure As previously described, the upper ULK level may once again be altered by adding trenches and vias to provide additional interconnects or by connected the Cu connect to previous level(s).

Figure 8:
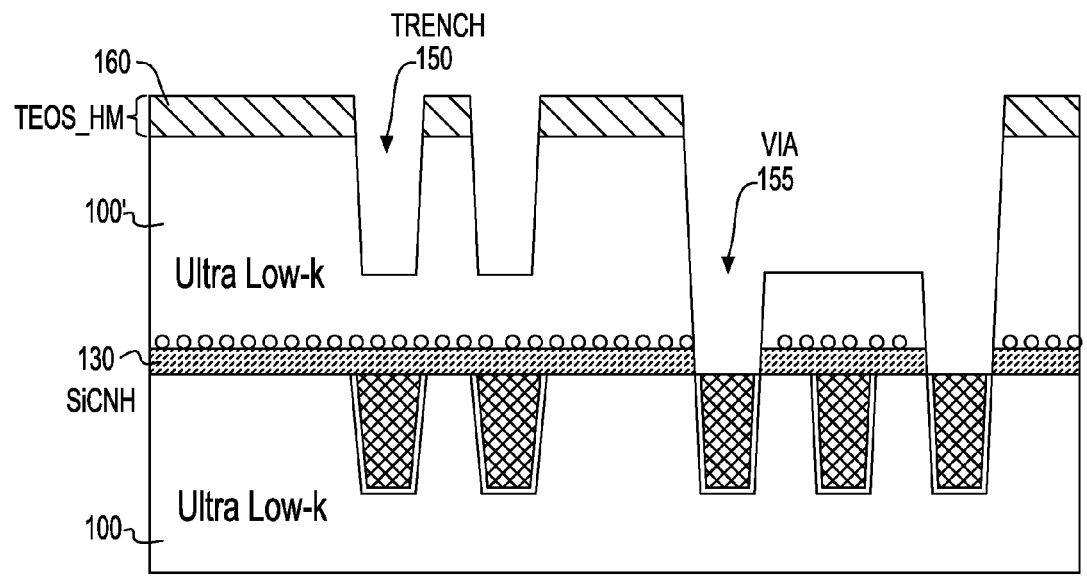
FIG. 8 is a side cross sectional view of one embodiment showing the formation of a TEOS HM layer for lithographic purposes, followed by an ULK etch to form trenches and vias followed by a selective removal of the nanoparticles.

The foregoing is illustrated with reference to FIG. 8 that illustrates the upper level by ULK etch, removing the nanoparticles preferably with organic solvents at the open areas created by RIE etching, followed by DHF (dilute hydrofluoric acid) to clean the solvents and other residuals. The process is advantageously achieved by providing the top level with a deposition of a TEOS hardmask (HM) 160, for lithographic purposes, preferably formed using PECVD. The thickness of the TEOS HM may preferably range from 15 nm to 50 nm. Depicted in FIG. 8 are also shown several trenches 150 and vias 155 formed by etching, including a selected removal of the nanoparticles, where there is a need to make contact with the Cu plated trenches in the first ULK substrate. The purpose of the additional trenches thus formed is to make it possible to form a multilevel network of interconnects necessary for VLSI chips.

Figure 9:
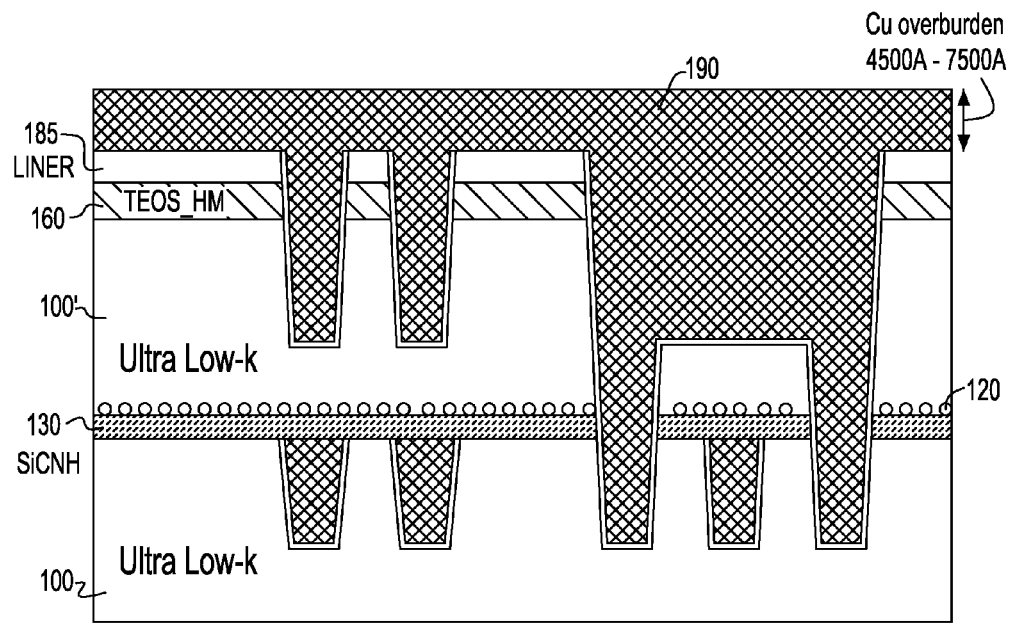
FIG. 9 shows a side cross sectional view illustrating an in-situ Cu seed and TaN/Ta liner deposition, followed by electroplated copper deposition, filling the trenches and vias.

Referring to FIG. 9, the previously described TEOS HM deposition 160 is shown having an in-situ TaN/Ta liner deposition 185 followed by Cu seed deposition and ECP copper 190, filling the trenches and vias and an anneal. The structure thus formed is preferably planarized using CMP. The electrochemical plating is used to fill the dual damascene trenches with copper, is typically carried out at room temperature (25° C.). The copper seed layer is deposited using physical deposition techniques, such as sputtering, consisting of copper alloys (i.e. Aluminum, Manganese or other alloying elements).

Figure 10:
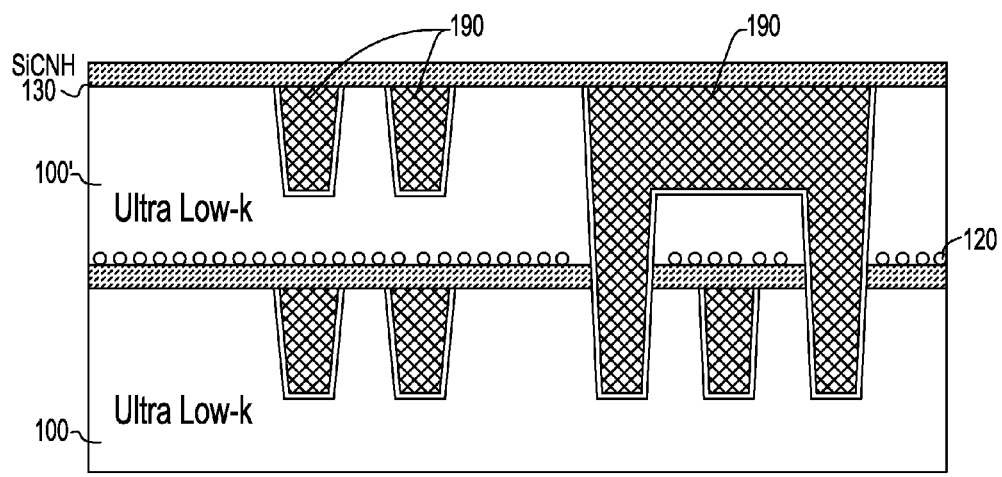
FIG. 10 is a side cross sectional view showing a final BEOL stack depicting the multi-level structure nanoparticles placed in the interface between the ULK dielectric and SiCNH cap, in accordance with an embodiment of the invention.

Referring to FIG. 10, there is shown a scheme of the final BEOL stack with nanoparticles between the low-k and SiCNH cap. The structure is polished and planarized by way of CMP. The process is followed by the SiCNH cap deposition. Additional monolayers of nanoparticles can be formed on top of each subsequent combination of ULK layer topped by a SiCNH cap, thereby creating a multi-level structure.

To summarize, the present description describes a multi-level structure to create a BEOL stack, typically of the order of 15 to 22 levels. A preferred process used for each level forming the stack, includes:
1. Spinning nanoparticles and drying out the solution;
2. Depositing the next level ULK followed by UV cure;
3. Lithographic patterning of lines or vias;
4. Transferring of line or via pattern into the ULK dielectric by etching;
5. Removing the nanoparticles at the bottom of the open areas with organic solvents, (i.e., open areas formed by the RIE process, wherein lines and vias are opened in the ULK film);
6. Diluting an HF (DHF) rinse of solvents and RIE residuals;
7. In-situ depositing a TaN/Ta liner and Cu seed by physical vapor deposition (PVD), followed by an electrochemical plating (ECP) of Cu, and annealing said Cu;
8. CMP the copper and liner overburden;
9. Depositing a SiCNH cap; and
10. Returning to step 1.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A multi-layer semiconductor structure comprising:
    one or more ultra low-k (ULK) dielectric layers with each alternating ULK dielectric layer having a plurality of metal filled trenches and vias formed therein,
    a cap, capping and sealing said ULK dielectric layers having said plurality of metal filled trenches and vias; and
    nanoparticles forming a monolayer at an interface between said ULK dielectric layers and said caps.

2. The multi-layer structure as recited in claim 1, wherein said nanoparticles are multi-sized.

3. The multi-layer structure as recited in claim 2 wherein said nanoparticles inserted between said cap and said ULK layer attenuate and absorb UV radiation during ULK curing.

4. The multi-layer structure as recited in claim 1, wherein said nanoparticles are synthesized in a chemical solution, and subsequently dried out by removing said solution.

5. The multi-layer structure as recited in claim 4, wherein said solution is organic, including methanol, ethanol and higher alcohols.

6. The multi-layer structure as recited in claim 1, wherein said nanoparticles' size varies between 1 nm and 4 nm.

7. The multi-layer structure as recited in claim 1 further comprising said nanoparticles having multi-distributed sizes to absorb UV which wavelength ranges between 200 nm and 600 nm.

8. The multi-layer structure as recited in claim 1 wherein said nanoparticles absorb UV light before damage affects said cap.

9. The multi-layer structure as recited in claim 1, wherein said nanoparticles are made of metal oxide.

10. The multi-layer structure, as recited in claim 9, wherein said metal oxide is ZnO or $TiO_2$.

11. The multi-layer structure as recited in claim 1, wherein said nanoparticles are uniformly spun on said cap.

12. The multi-layer structure as reciting in claim 1 further comprising:
    a. a spinned-on solution on said nanoparticles dried-out of solvent;
    b. a next level ULK deposited and cured with UV, said ULK being etched and said nanoparticles removed from etched open areas;
    d. a refractory liner and a conductive layer and electroplated and copper filling said open areas, wherein said refractory liner and conductive layer are polished; and
    f. a dielectric cap deposited thereon.

13. The method as recited in claim 12, wherein said conductive layer is made of Cu or Cu alloy.

14. The multi-layer structure as recited in claim 12, wherein said dielectric cap is made of SiCHN.

15. The multi-layer structure as recited in claim 12, wherein said drying out of said nanoparticles uses an organic solvent.

16. The multi-layer structure as recited in claim 12, wherein said polishing is followed by cleaning said solvents and other residuals.

17. The multi-layer structure as recited in claim 12, wherein said refractory liner is made of TaN, Ta, W, WNx, TiNx, Ru, or Co.

18. The multi-layer structure as recited in claim 12, wherein cleaning said solvents and residuals uses dilute hydrofluoric acid (DHF).

19. The multi-layer structure as recited in claim 12, wherein said trench filling are plated.

20. The multi-layer structure as recited in claim 12, wherein said polishing uses a chemical mechanical polish (CMP).

21. The multi-layer structure as recited in claim 12, wherein said ultra low-k (ULK) dielectrics are cured.

22. The multi-layer structure as recited in claim 12, wherein radiation penetrates through said ULK dielectric, reaching said cap.

* * * * *